United States Patent
Chan

(10) Patent No.: US 7,276,755 B2
(45) Date of Patent: Oct. 2, 2007

(54) INTEGRATED CIRCUIT AND METHOD OF MANUFACTURE

(75) Inventor: Darin A. Chan, San Francisco, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 57 days.

(21) Appl. No.: 11/119,660

(22) Filed: May 2, 2005

(65) Prior Publication Data

US 2006/0246707 A1 Nov. 2, 2006

(51) Int. Cl.
*H01L 29/76* (2006.01)

(52) U.S. Cl. ............... 257/314; 257/295; 257/296; 257/315; 257/E27.004; 438/257; 438/593; 365/65; 365/117

(58) Field of Classification Search ........ 438/257–258, 438/424–430, 275, 308; 257/314–316
See application file for complete search history.

(56) References Cited

U.S. PATENT DOCUMENTS 6,287,951 B1 9/2001 Lucas 6,730,566 B2 * 5/2004 Niimi et al. ................. 438/275
2002/0081794 A1 6/2002 Ito
2004/0219753 A1 * 11/2004 Ohno ......................... 438/275

FOREIGN PATENT DOCUMENTS

EP 0 252 179 1/1988

* cited by examiner

Primary Examiner—Dung A. Le
(74) Attorney, Agent, or Firm—Farjami & Farjami LLP

(57) ABSTRACT

An integrated circuit having a plurality of active areas separated from each other by a field region and a method for manufacturing the integrated circuit. A first polysilicon finger is formed over the first active area and the field region and a second polysilicon finger is formed over the second active area and the field region. A first dielectric layer is formed over the first active area and the field region and a second dielectric layer is formed over the second active area and the portion of the first dielectric layer over the field region. A first electrical interconnect is formed over and dielectrically isolated from the first polysilicon finger and a second electrical interconnect is formed over and dielectrically isolated from the second active area. The second electrical interconnect is electrically coupled to the second polysilicon finger.

9 Claims, 11 Drawing Sheets

INTEGRATED CIRCUIT AND METHOD OF MANUFACTURE

FIELD OF THE INVENTION

The present invention relates, in general, to an integrated circuit and, more particularly, to an insulating structure in an integrated circuit.

BACKGROUND OF THE INVENTION

Integrated circuits are generally comprised of a plurality of active devices and passive devices that are manufactured from a semiconductor substrate. Active devices include transistors and diodes, whereas passive devices include resistors and capacitors. The manufacture of integrated circuits involves many processing steps including oxidation, material deposition, photolithography, etching, ion implantation, silicide formation, and metal interconnect formation. For example, a semiconductor device such as a transistor may be manufactured by forming a gate dielectric layer on a semiconductor substrate and forming a polysilicon layer on the gate dielectric layer. A layer of photoresist is patterned on the polysilicon layer to leave portions of the polysilicon layer exposed. The exposed portions of the polysilicon layer are anisotropically etched to form gate structures and to expose portions of the gate dielectric material adjacent the gate structure. The remaining portions of the photoresist are removed and a layer of dielectric material is formed over the gate structure and the gate dielectric material. The gate dielectric material is anisotropically etched to form spacers adjacent the sides of the gate structure. An impurity material is implanted into the portions of the semiconductor substrate adjacent the spacers to form doped regions. The impurity material is also implanted into the polysilicon portion of the gate structure. A layer of dielectric material is formed over the gate structure and the exposed portions of the semiconductor substrate. Silicide is formed from the gate structure and from the doped regions. An etch stop layer is formed over the gate structure and the silicide. A layer of dielectric material may be formed over the etch stop layer. Optionally, another etch stop layer may be formed over the dielectric layer and another layer of dielectric material may be formed over the second etch stop layer. The etch stop layers are typically formed from dielectric materials. Electrical interconnects may be formed from the layers of dielectric material and from the etch stop layers using for example a single damascene process or a dual damascene process. The electrical interconnects electrically couple semiconductor devices to each other.

Thus, dielectric materials serve a variety of functions during the manufacture of integrated circuits as well as in the integrated circuits themselves. For example, they act as etch masks, implant masks, etch stop layers, protective masks, spacers, strain inducement structures, etc. In addition, they provide electrical isolation between different electrically conductive devices in the integrated circuits. A drawback with using dielectric materials in the formation of semiconductor devices is that processing steps designed to etch one of the dielectric layers may etch through other dielectric layers causing electrical shorts between semiconductor devices or within semiconductor devices.

Accordingly, it would be advantageous to have an integrated circuit and a method for manufacturing the integrated circuit that inhibits electrical shorting of semiconductor devices and that is compatible with a variety of semiconductor processes. It would be of further advantage for the integrated circuit to be cost efficient and for the method to be cost and time efficient.

SUMMARY OF THE INVENTION

The present invention satisfies the foregoing need by providing an integrated circuit having multiple dielectric layers for increasing electrical interconnect routing versatility and a method for manufacturing the integrated circuit. In accordance with one aspect, the present invention comprises a method for manufacturing an integrated circuit that includes providing a semiconductor substrate having at least one active area and at least one field region, wherein the at least one active area has at least one semiconductor device formed therefrom. A first dielectric layer is formed over the at least one active area and the at least one field region. A second dielectric layer is formed over a portion of the first dielectric layer. A portion of the second dielectric layer that is over the at least one active area is removed. At least one interconnect is formed that extends from the at least one semiconductor device over the at least one active area and over the at least one field region.

In accordance with another aspect, the present invention includes a method for manufacturing an integrated circuit comprising providing a semiconductor substrate having first and second active areas that are electrically isolated from each other by a field region. A first semiconductor device is formed from the first active area and a second semiconductor device is formed from the second active area. A first layer of dielectric material is formed over the first active area and over the field region. A second layer of dielectric material is formed over the second active area and over the portion of the first layer of dielectric material over the field region. The first layer of dielectric material is substantially absent from areas over the second active area and second layer of dielectric material is substantially absent from areas over the first active area.

In accordance with yet another aspect, the present invention comprises an integrated circuit that includes a semiconductor substrate having an active area and a field region and a semiconductor device formed from the active area. A strip of polysilicon is disposed over a portion of the active area and the field region. A first layer of dielectric material is disposed over the active area and the field region and a second layer of dielectric material is disposed over the portion of the first layer of dielectric material that is disposed over the field region. An electrical interconnect structure is disposed over the strip of polysilicon, wherein the electrical interconnect structure is dielectrically separated from the strip of polysilicon.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Figure 1:
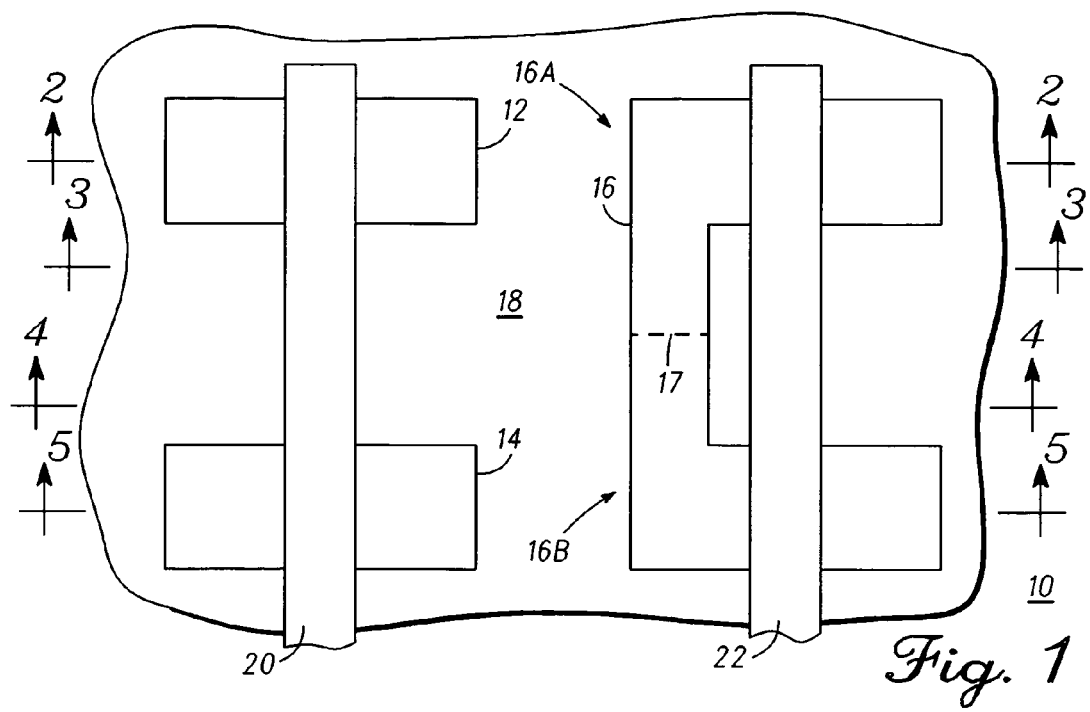
FIG. 1 is a top view of an integrated circuit at a beginning stage of manufacture in accordance with an embodiment of the present invention.

FIG. 1 is a top view of a portion of an integrated circuit 10 at an intermediate stage of manufacture in accordance with an embodiment of the present invention. For the sake of clarity, FIG. 1 will be described in conjunction with FIGS. 2-5, which are cross-sectional side views taken along different portions of integrated circuit 10. It should be understood that the cross-sectional side views of FIGS. 2-5 are taken at the same step in the manufacturing process. What is shown in FIG. 1 is a top view of integrated circuit 10 having active areas 12, 14, and 16 laterally separated by a field region 18. Active areas are also referred to as active regions. Preferably, active area 12 is doped with an impurity material or dopant of N-type conductivity and active area 14 is doped with an impurity material or dopant of P-type conductivity. Examples of impurity materials of N-type conductivity include phosphorus and arsenic and examples of impurity materials of P-type conductivity include boron and indium. Active area 16 is a C-shaped region having sub-areas 16A and 16B. By way of example active area 16 is divided so that sub-areas 16A and 16B are L-shaped. Although sub-areas 16A and 16B are shown as being L-shaped, this is not a limitation of the present invention. The boundary between sub-areas 16A and 16B is identified by broken line 17 and forms a P-N junction. In accordance with one embodiment, sub-area 16A is doped with an impurity material of N-type conductivity and sub-area 16B is doped with an impurity material of P-type conductivity. Although active area 16 is shown and described as a C-shaped region having sub-areas 16A and 16B of opposite conductivity type, this is not a limitation of the present invention. Area 16 can be of a single conductivity type.

A polysilicon finger 20 crosses over active areas 12 and 14 and a portion of field region 18 and a polysilicon finger 22 crosses over sub-areas 16A and 16B of active area 16 and a portion of field region 18. Polysilicon fingers 20 and 22 are spaced apart from each other. Although polysilicon fingers 20 and 22 are shown as being substantially parallel to each other, this is not a limitation of the present invention. Polysilicon fingers are also referred to strips or layers of polysilicon.

Figure 2:
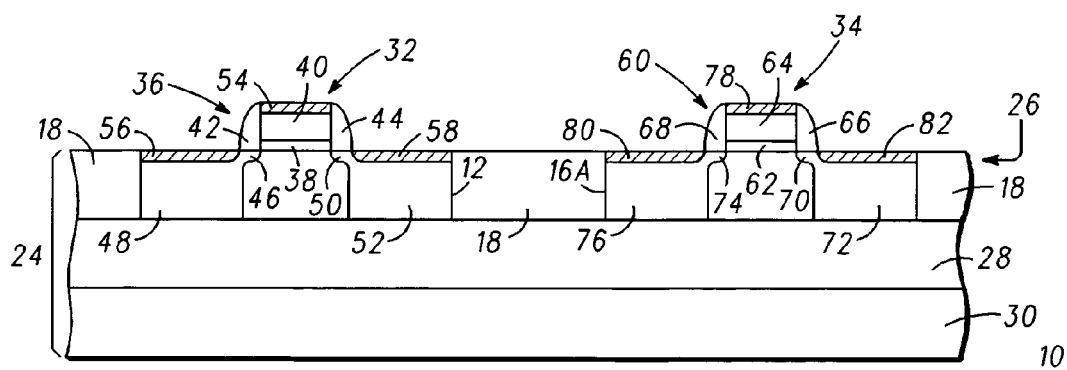
FIG. 2 is a cross-sectional side view of the integrated circuit taken along section line 2-2 of FIG. 1.

FIG. 2 is a cross-sectional side view of integrated circuit 10 taken along section line 2-2 of FIG. 1, i.e., taken through active area 12, sub-area 16A, and the portion of field region 18 therebetween. What is shown in FIG. 2 is a cross-sectional side view of an SOI substrate 24 comprising a silicon active layer 26 disposed on a layer of dielectric material 28 which is disposed on a body of semiconductor material 30. Silicon active layer 26 has a thickness ranging from that of a monolayer of silicon to approximately 1,000 Angstroms (Å) and dielectric layer 28 has a thickness ranging from about 100 Å to about 5,000 Å. It should be understood that the type of substrate from which integrated circuit 10 is formed is not a limitation of the present invention. For example, integrated circuit 10 can be formed from a bulk silicon substrate, a germanium substrate, a silicon germanium substrate, a silicon-on-sapphire substrate, a compound semiconductor substrate, or the like.

A P-channel insulated gate field effect transistor 32 is formed from active area 12 and a P-channel insulated gate field effect transistor 34 is formed from sub-area 16A of active area 16. Insulated gate field effect transistors are also referred to as field effect transistors, semiconductor devices or transistors. P-channel insulated gate field effect transistor 32 includes a gate structure 36 comprising a gate dielectric 38 and a gate electrode 40. Gate electrode 40 is formed from a portion of polysilicon finger 20. Spacers 42 and 44 are formed along the sides of gate structure 36. A source extension region 46 and a source region 48 are formed in the portion of active area 12 adjacent the side of gate structure 36 abutting spacer 42 and a drain extension region 50 and a drain region 52 are formed in the portion of active area 12 on the side of gate structure 36 abutting spacer 44. Silicide regions 54, 56, and 58 are formed from gate electrode 40, source region 48, and drain region 52, respectively. It should be understood that silicide is formed along the length of polysilicon finger 20 and that gate silicide 54 is a portion of the silicide formed from polysilicon finger 20.

P-channel insulated gate field effect transistor 34 comprises a gate structure 60 having a gate dielectric 62 and a gate electrode 64. Gate electrode 64 is formed from a portion of polysilicon finger 22. Spacers 66 and 68 are formed along the sides of gate structure 60. A source extension region 70 and a source region 72 are formed in the portion of sub-area 16A adjacent the side of gate structure 60 abutting spacer 66 and a drain extension region 74 and a drain region 76 are formed in the portion of sub-area 16A on the side of gate structure 60 abutting spacer 68. Silicide regions 78, 80, and 82 are formed from gate electrode 64, source region 72, and drain region 76, respectively. It should be understood that silicide is formed along the length of polysilicon finger 22 and that gate silicide 78 is a portion of the silicide formed from polysilicon finger 22.

Figure 3:
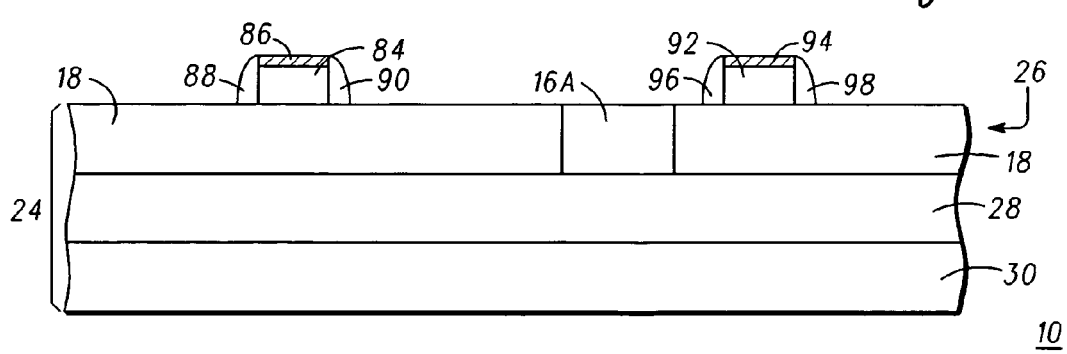
FIG. 3 is a cross-sectional side view of the integrated circuit taken along section line 3-3 of FIG. 1.

FIG. 3 is a cross-sectional side view of integrated circuit 10 taken along section line 3-3 of FIG. 1, i.e., a cross-sectional side view of a portion of SOI substrate 24 having field region 18 and sub-area 16A disposed on dielectric layer 28. What is shown in FIG. 3 is a portion 84 of polysilicon finger 20 disposed on field region 18 and a silicide layer 86 formed from portion 84. Silicide layer 86 is a portion of the silicide formed from polysilicon finger 20. Likewise, spacers 88 and 90 are part of the dielectric material forming spacers 42 and 44, respectively.

A portion 92 of polysilicon finger 22 is disposed on field region 18 and a silicide layer 94 is formed from portion 92. Silicide layer 94 is a portion of the silicide formed from polysilicon finger 22. Likewise, spacers 68 and 66 are part of the dielectric material forming spacers 96 and 98, respectively.

Figure 4:
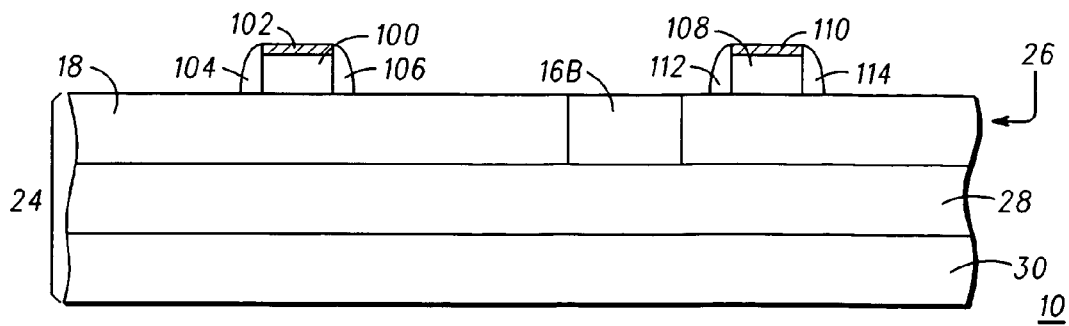
FIG. 4 is a cross-sectional side view of the integrated circuit taken along section line 4-4 of FIG. 1.

FIG. 4 is a cross-sectional side view of integrated circuit 10 taken along section line 4-4 of FIG. 1, i.e., a cross-sectional side view of a portion of SOI substrate 24 having field region 18 and sub-area 16B disposed on dielectric layer 28. What is shown in FIG. 4 is a portion 100 of polysilicon finger 20 disposed on field region 18 and a silicide layer 102 formed from portion 100. Silicide layer 100 is a portion of the silicide formed from polysilicon finger 20. Likewise, spacer 104 is part of the dielectric material forming spacers 42 and 88 and spacer 106 is part of the dielectric material forming spacers 44 and 90.

A portion 108 of polysilicon finger 22 is disposed on field region 18 and a silicide layer 110 is formed from portion 108. Silicide layer 110 is a portion of the silicide formed from polysilicon finger 22. Likewise, spacer 112 is part of the dielectric material forming spacers 68 and 96 and spacer 114 is part of the dielectric material forming spacers 66 and 98.

Figure 5:
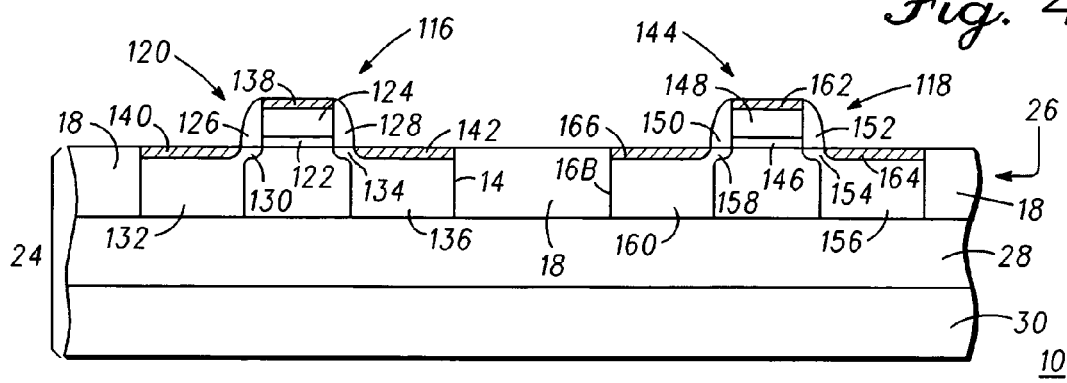
FIG. 5 is a cross-sectional side view of the integrated circuit taken along section line 5-5 of FIG. 1.

FIG. 5 is a cross-sectional side view of integrated circuit 10 taken along section line 5-5 of FIG. 1, i.e., taken through active area 14, sub-area 16B, and the portion of field region 18 therebetween. What is shown in FIG. 5 is a cross-sectional side view of active areas 14 and 16B and field region 18 disposed on layer of dielectric material 28. An N-channel insulated gate field effect transistor 116 is formed from active area 14 and an N-channel insulated gate field effect transistor 118 is formed from sub-area 16B of active area 16. N-channel insulated gate field effect transistor 116 includes a gate structure 120 comprising a gate dielectric 122 and a gate electrode 124. Gate electrode 124 is formed from a portion of polysilicon finger 20. Spacers 126 and 128 are formed along the sides of gate structure 120. A source extension region 130 and a source region 132 are formed in the portion of active area 14 adjacent the side of gate structure 120 abutting spacer 126 and a drain extension region 134 and a drain region 136 are formed in the portion of active area 14 on the side of gate structure 120 abutting spacer 128. Silicide regions 138, 140, and 142 are formed from gate electrode 124, source region 132, and drain region 136, respectively. It should be understood that silicide is formed along the length of polysilicon finger 20 and that gate silicide 138 is a portion of the silicide formed from polysilicon finger 20.

N-channel insulated gate field effect transistor 118 includes a gate structure 144 comprising a gate dielectric 146 and a gate electrode 148. Gate electrode 148 is formed from a portion of polysilicon finger 22. Spacers 150 and 152 are formed along the sides of gate structure 144. A source extension region 154 and a source region 156 are formed in the portion of sub-area 16B adjacent the side of gate structure 144 abutting spacer 152 and a drain extension region 158 and a drain region 160 are formed in the portion of sub-area 16B on the side of gate structure 144 abutting spacer 150. Silicide regions 162, 164, and 166 are formed from gate electrode 148, source region 156, and drain region 160, respectively. It should be understood that silicide is formed along the length of polysilicon finger 22 and that gate silicide 162 is a portion of the silicide formed from polysilicon finger 22.

Figure 6:
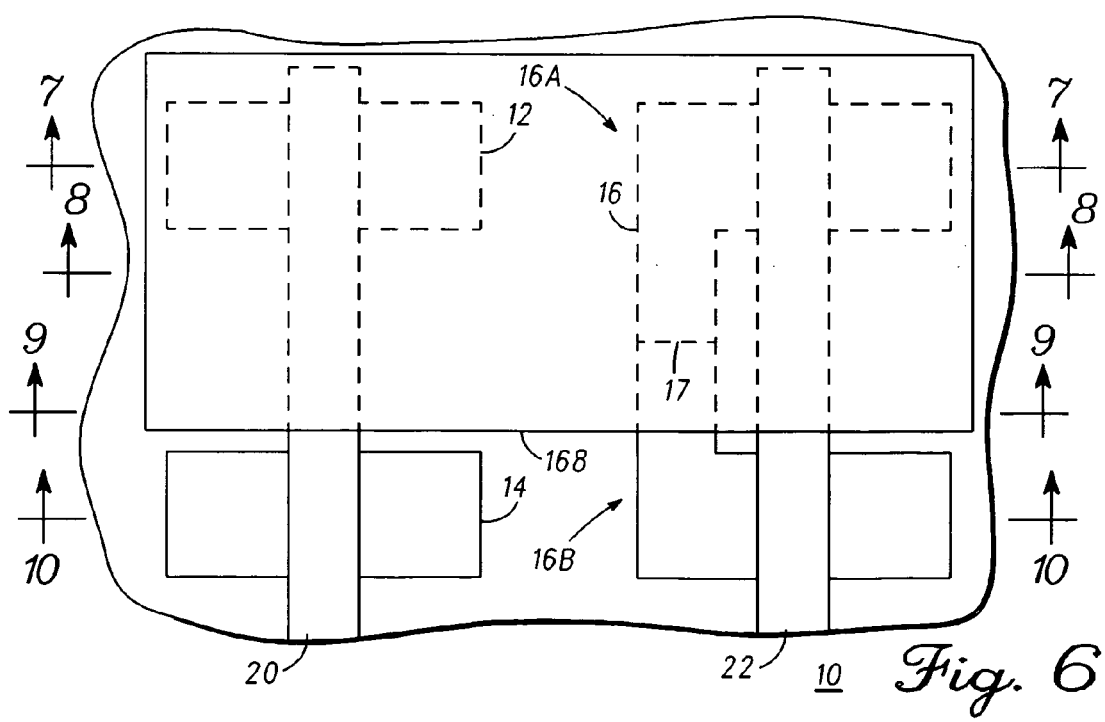
FIG. 6 is a top view of the integrated circuit of FIGS. 1-5 further along in manufacture.

Referring now to FIG. 6, a top view of a portion 168 of a layer of dielectric material formed over active areas 12, 14, and 16, and over field region 18 is illustrated. By way of example, the dielectric layer is silicon nitride having a thickness ranging from about 50 Å to about 5,000 Å. Preferably, the silicon nitride is a compressively stressed nitride deposited using plasma-enhanced chemical vapor deposition ("PECVD") techniques. A layer of photoresist (not shown) is disposed on the compressively stressed PECVD nitride layer and patterned to expose a portion of the compressively stressed PECVD nitride layer over active areas 14 and 16B. The exposed portion of the compressively stressed PECVD nitride layer is etched using an anisotropic reactive ion etch to expose active areas 14 and 16B. After etching, the photoresist is removed and portion 168 of the compressively stressed PECVD nitride layer remains. Because portion 168 of the compressively stressed PECVD nitride layer remains over active areas 12 and 16A, a portion of active area 16B, and portions of polysilicon fingers 20 and 22, these portions are illustrated by broken lines, whereas active area 14 and the exposed portions of active area 16B and polysilicon fingers 20 and 22 are illustrated by solid lines.

Figure 7:
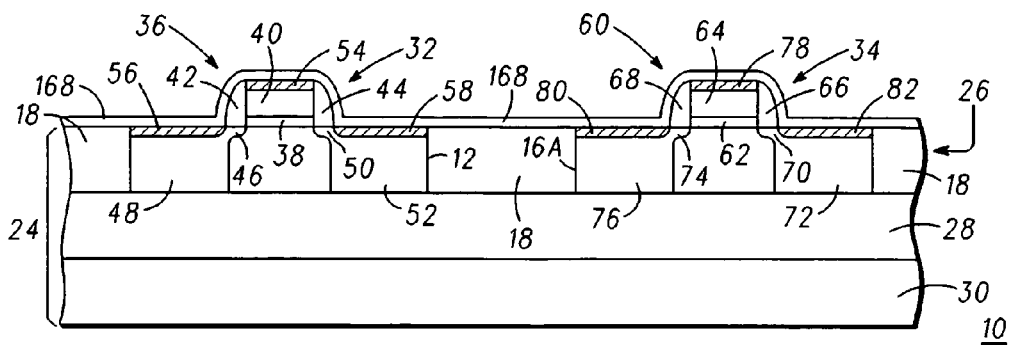
FIG. 7 is a cross-sectional side view of the integrated circuit taken along section line 7-7 of FIG. 6.

FIG. 7 is a cross-sectional side view of integrated circuit 10 taken along section line 7-7 of FIG. 6, i.e., a cross-sectional side view taken through active area 12 and sub-area 16A. FIG. 7 follows from FIG. 2. After the compressively stressed PECVD nitride layer has been anisotropically etched, portion 168 remains over transistors 32 and 34.

Figure 8:
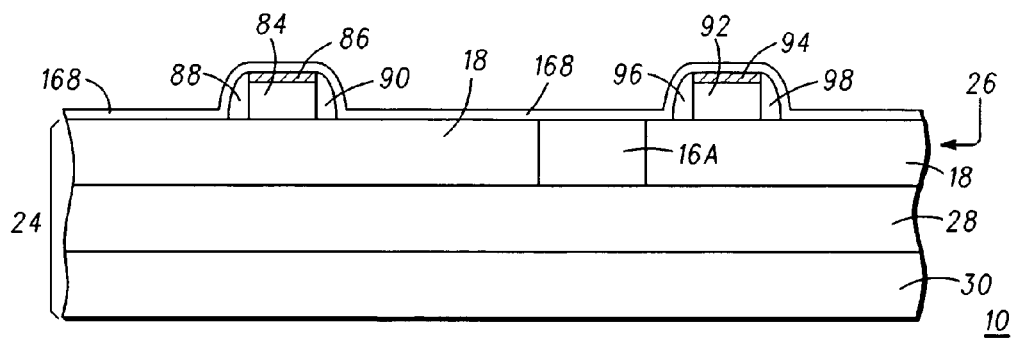
FIG. 8 is a cross-sectional side view of the integrated circuit taken along section line 8-8 of FIG. 6.

FIG. 8 is a cross-sectional side view of integrated circuit 10 taken along section line 8-8 of FIG. 6, i.e., a cross-sectional side view taken through field region 18 and sub-area 16A. FIG. 8 follows from FIG. 3. After the compressively stressed PECVD nitride layer has been anisotropically etched, portion 168 remains over the portions 84 and 92 of polysilicon fingers 20 and 22 which have silicide layers 86 and 94, respectively, formed therefrom. Portion 168 also remains over field region 18 and active area 16A.

Figure 9:
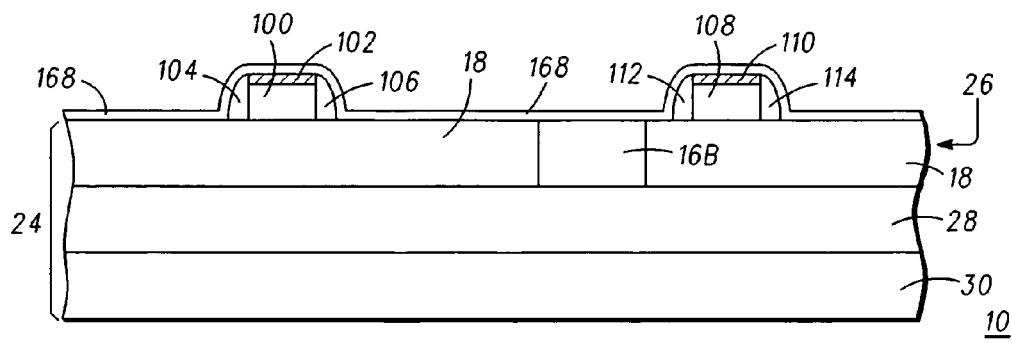
FIG. 9 is a cross-sectional side view of the integrated circuit taken along section line 9-9 of FIG. 6.

FIG. 9 is a cross-sectional side view of integrated circuit 10 taken along section line 9-9 of FIG. 6, i.e., a cross-sectional side view taken through field region 18 and sub-area 16B. FIG. 9 follows from FIG. 4. After the silicon nitride layer has been anisotropically etched, portion 168 of the layer of silicon nitride remains over portions 100 and 108 of polysilicon fingers 20 and 22 which have silicide layers 102 and 110, respectively. Portion 168 also remains over field region 18 and active area 16B.

Figure 10:
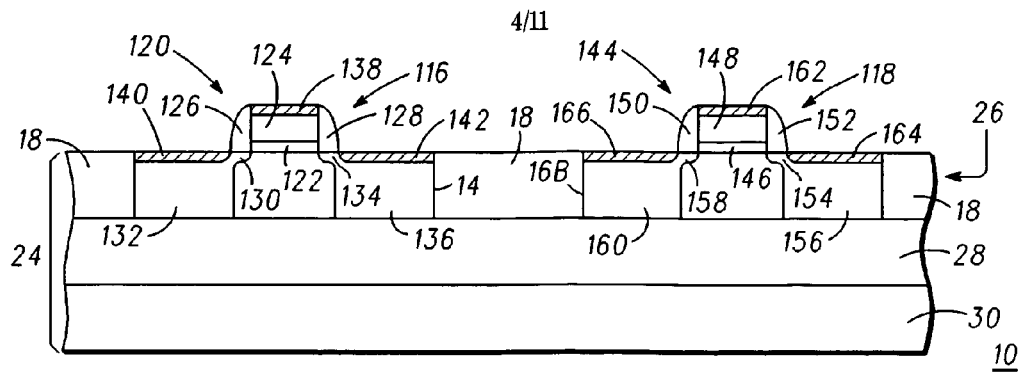
FIG. 10 is a cross-sectional side view of the integrated circuit taken along section line 10-10 of FIG. 6.

FIG. 10 is a cross-sectional side view of integrated circuit 10 taken along section line 10-10 of FIG. 6, i.e., a cross-sectional side view taken through active area 14, field region 18, and sub-area 16B. FIG. 10 follows from FIG. 5. Portion 168 of the compressively stressed PECVD nitride layer has been removed from transistors 120 and 144 and a portion of field region 18. Therefore, the cross-sectional side view of FIG. 10 looks similar to that of FIG. 5.

Figure 11:
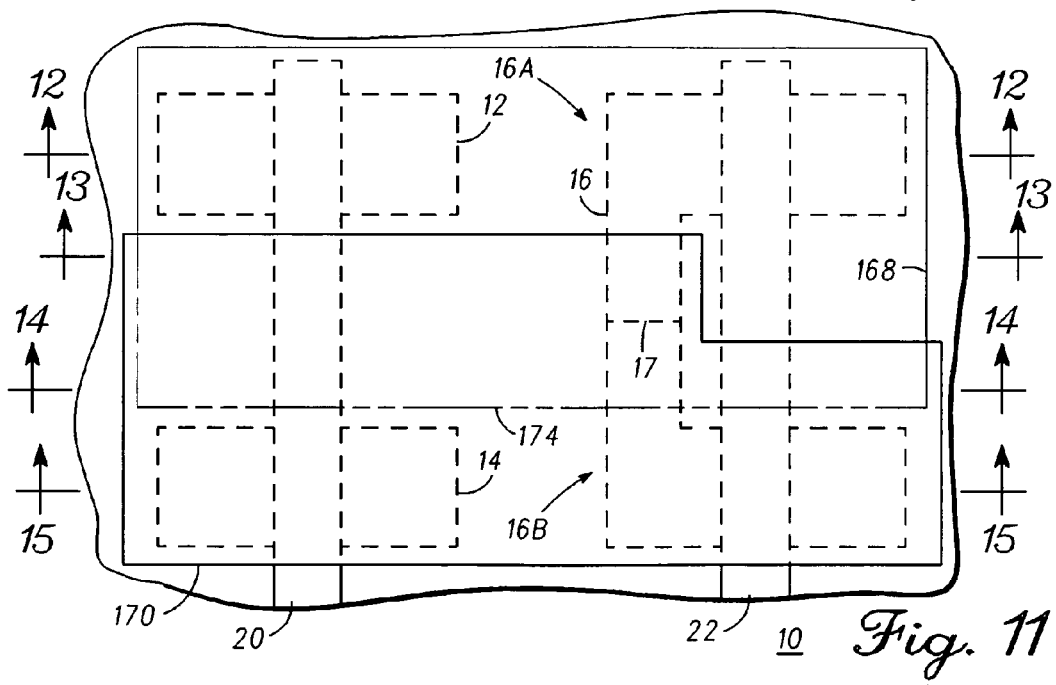
FIG. 11 is a top view of the integrated circuit of FIGS. 6-10 further along in manufacture.

Referring now to FIG. 11, a top view of a portion 170 of a layer of dielectric material formed over active areas 14 and 16B, over field region 18, and over portion 168 of the compressively stressed PECVD nitride layer is illustrated. By way of example, the layer is silicon nitride having a thickness ranging from about 50 Å to about 5,000 Å. Preferably, the silicon nitride is a tensilely stressed nitride deposited using PECVD techniques. A layer of photoresist (not shown) is disposed on the tensilely stressed PECVD nitride layer and patterned to expose a portion of the tensilely stressed PECVD nitride layer over active areas 12 and 16A. The exposed portion of the tensilely stressed PECVD nitride layer is etched using an anisotropic reactive ion etch to expose the portion 168 of compressively stressed PECVD nitride layer over active areas 12 and 16A. After etching, the photoresist is removed and portion 170 of the tensilely stressed PECVD nitride layer remains. Thus, portion 168 of the compressively stressed PECVD nitride layer remains over active area 12 and sub-area 16A, over the areas of field region 18 between active areas 12 and 14, and over the portions of sub-areas 16A and 16B adjacent the P-N junction identified by reference number 17. Portion 170 of the tensilely stressed PECVD nitride layer remains over the sub-portion of portion 168 that is over the areas of field region 18 between active areas 12 and 14 and the portions of sub-areas 16A and 16B adjacent the P-N junction identified by reference number 17. Portion 170 also remains over active area 14 and portions of sub-area 16B and field region 18. Because active areas 12, 14, and 16, field region 18, and polysilicon fingers 20 and 22 are covered by either a compressively stressed PECVD nitride layer, a tensilely stressed PECVD nitride layer, or both, these areas are illustrated by broken lines. It should be understood that the order of forming the PECVD nitride layers is not a limitation of the present invention. For example, the tensilely stressed PECVD nitride layer may be formed and etched before forming and etching the compressively stressed PECVD nitride layer. Alternatively, both PECVD nitride layers may be compressively stressed PECVD nitride layers, tensilely stressed PECVD nitride layers, or silicon nitride that is not formed by PECVD techniques.

Figure 12:
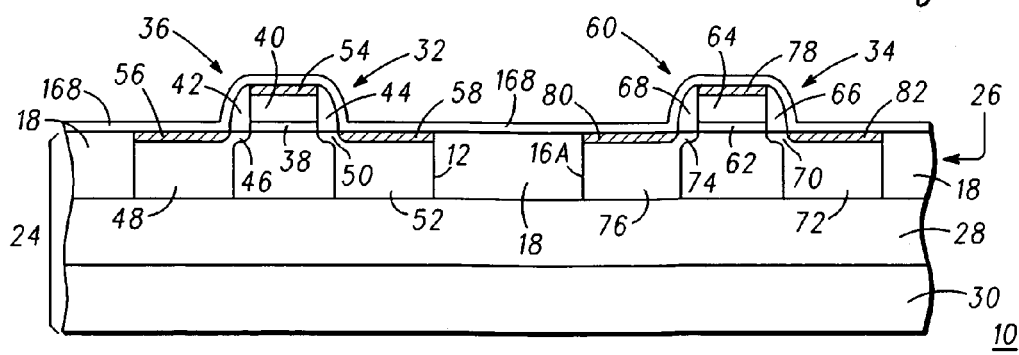
FIG. 12 is a cross-sectional side view of the integrated circuit taken along section line 12-12 of FIG. 11.

FIG. 12 is a cross-sectional side view of integrated circuit 10 taken along section line 12-12 of FIG. 11, i.e., a cross-sectional side view taken through active area 12 and sub-area 16A. FIG. 12 follows from FIG. 7. Portion 168 of the compressively stressed PECVD nitride layer remains over transistors 32 and 34 and a portion of field region 18 after the tensilely stressed PECVD nitride layer has been anisotropically etched.

Figure 13:
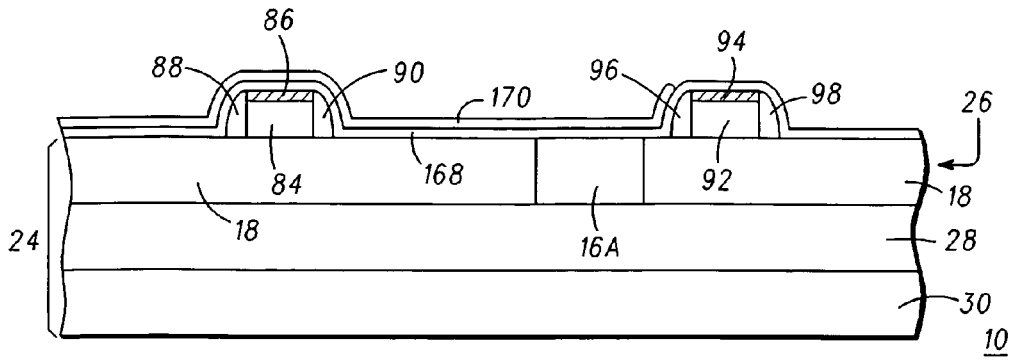
FIG. 13 is a cross-sectional side view of the integrated circuit taken along section line 13-13 of FIG. 11.

FIG. 13 is a cross-sectional side view of integrated circuit 10 taken along section line 13-13 of FIG. 11, i.e., a cross-sectional side view taken through field region 18 and sub-area 16A. FIG. 13 follows from FIG. 8. After the tensilely stressed PECVD nitride layer has been anisotropically etched, portion 168 of the compressively stressed PECVD nitride layer remains over the portions 84 and 92 of polysilicon fingers 20 and 22 having silicide 86 and 94, respectively, over field region 18, and over active area 16A. Portion 170 of the tensilely stressed PECVD nitride layer remains over portion 168 of the compressively stressed PECVD nitride layer that is over portion 84, over sub-area 16A, and over a portion of field region 18. However, portion 170 of the tensilely stressed PECVD nitride layer has been etched away from the sub-portion of portion 168 of the compressively stressed PECVD nitride layer that is over portion 92 of polysilicon finger 22.

Figure 14:
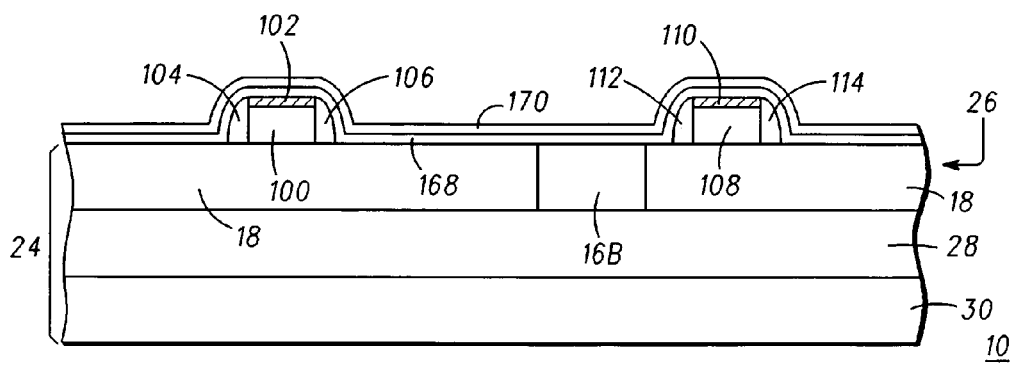
FIG. 14 is a cross-sectional side view of the integrated circuit taken along section line 14-14 of FIG. 11.

FIG. 14 is a cross-sectional side view of integrated circuit 10 taken along section line 14-14 of FIG. 1, i.e., a cross-sectional side view taken through field region 18 and sub-area 16B. FIG. 14 follows from FIG. 9. After anisotropically etching portion 170 of the tensilely stressed PECVD nitride layer, portions 168 and 170 of the PECVD nitride layers remain over portions 100 and 108 of polysilicon fingers 20 and 22 having silicide layers 102 and 110, respectively, over field region 18, and over active area 16B.

Figure 15:
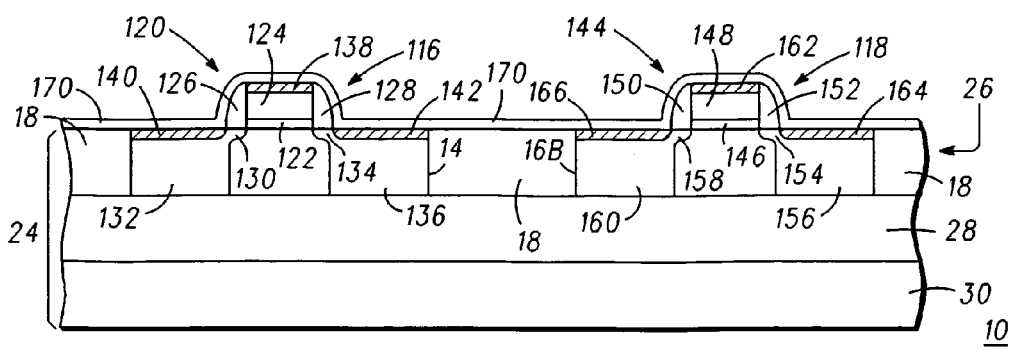
FIG. 15 is a cross-sectional side view of the integrated circuit taken along section line 15-15 of FIG. 11.

FIG. 15 is a cross-sectional side view of integrated circuit 10 taken along section line 15-15 of FIG. 1, i.e., a cross-sectional side view taken through active area 14, field region 18, and sub-area 16B. FIG. 15 follows from FIG. 10. After anisotropically etching portion 170 of the tensilely stressed PECVD nitride layer, it remains over transistors 120 and 144 and a portion of field region 18.

Figure 16:
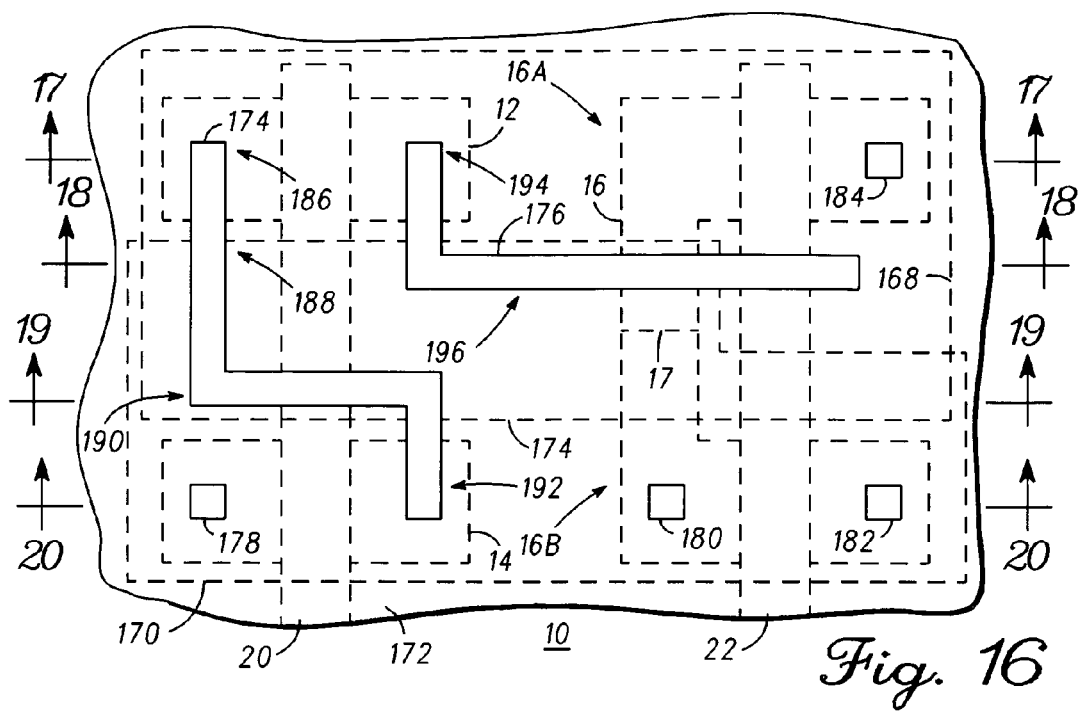
FIG. 16 is a top view of the integrated circuit of FIGS. 11-15 further along in manufacture.

Referring now to FIG. 16, a cross-sectional top view of a layer of dielectric material 172 such as, for example, silicon dioxide having a thickness ranging from about 1,000 Å to about 20,000 Å is disposed on portions 168 and 170 of the PECVD nitride layers. Trenches 174 and 176 and contact openings 178, 180, 182, and 184 are formed in dielectric layer 172 using, for example, a damascene process. Trench 174 has portions 186, 188, 190, and 192 and trench 176 has portions 194 and 196.

Figure 17:
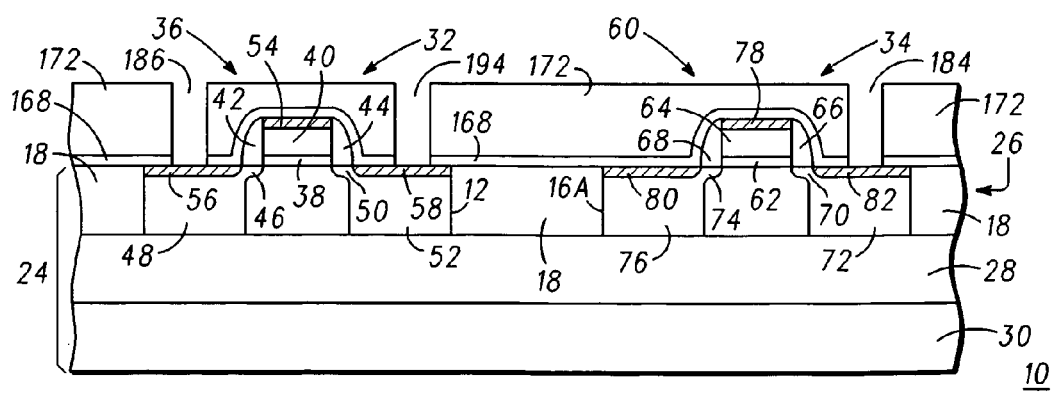
FIG. 17 is a cross-sectional side view of the integrated circuit taken along section line 17-17 of FIG. 16.

FIG. 17 is a cross-sectional side view of integrated circuit 10 taken along section line 17-17 of FIG. 16, i.e., a cross-sectional side view taken through active area 12 and sub-area 16A. FIG. 17 follows from FIG. 12. What is shown in FIG. 17 is dielectric layer 172 disposed on compressively stressed PECVD nitride layer 168. Portion 186 of trench 174, portion 194 of trench 176, and contact opening 184 are formed in dielectric layer 172 by patterning a photoresist layer (not shown) on dielectric layer 172 and anisotropically etching the exposed portions of dielectric layer 172 using an etchant that etches silicon dioxide. The etch stops on portion 168 of the compressively stressed PECVD nitride layer. Thus, portion 168 of the compressively stressed PECVD nitride layer is also referred to as an etch stop layer. After reaching portion 168, the etchant is changed to etch the portions of the compressively stressed PECVD nitride layer that are exposed by etching silicon dioxide layer 172. The etching of the sub-portions of portion 168 of the compressively stressed PECVD nitride layer terminates on silicide layers 56, 58, and 82.

Figure 18:
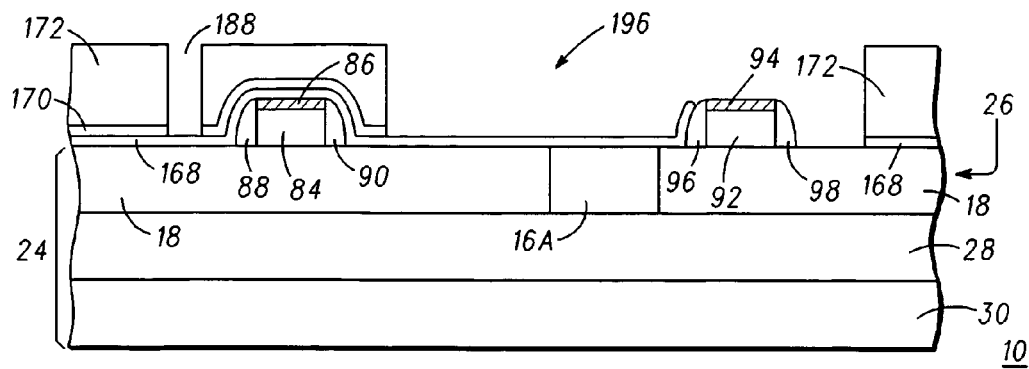
FIG. 18 is a cross-sectional side view of the integrated circuit taken along section line 18-18 of FIG. 16.

FIG. 18 is a cross-sectional side view of integrated circuit 10 taken along section line 18-18 of FIG. 16, i.e., a cross-sectional side view taken through field region 18 and sub-area 16A. FIG. 18 follows from FIG. 13. What is shown in FIG. 18 is dielectric layer 172 disposed on a sub-portion of portion 168 of the compressively stressed PECVD nitride layer. Portions 188 and 196 of trenches 174 and 176, respectively, are formed in dielectric layer 172 by patterning a photoresist layer (not shown) on dielectric layer 172 and anisotropically etching the exposed portions of dielectric layer 172 using an etchant that etches silicon dioxide. The etch stops on portion 170 of the tensilely stressed PECVD nitride layer. The etchant is changed to etch the portions 168 of the compressively stressed PECVD nitride layer that are exposed by etching silicon dioxide layer 172. The etching of the sub-portion of portion 170 of the tensilely stressed PECVD nitride layer occurs in regions having both portions 168 and 170 of the PECVD nitride layers and over field region 18 in areas having only portion. 168 of the compressively stressed PECVD nitride layer.

Figure 19:
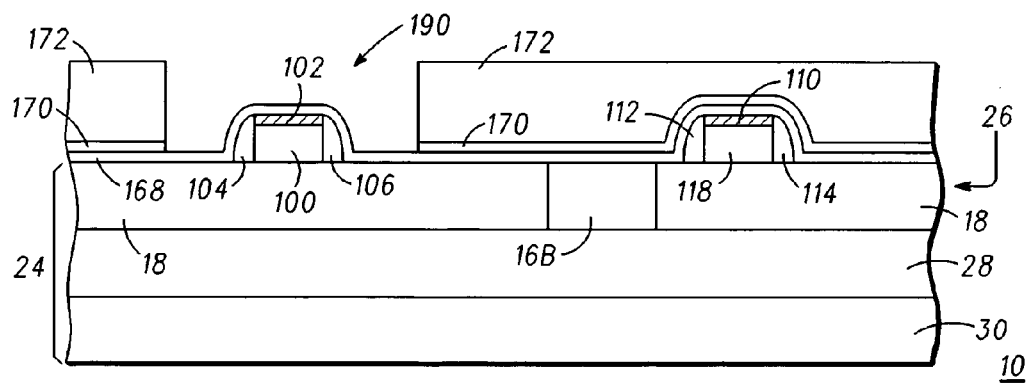
FIG. 19 is a cross-sectional side view of the integrated circuit taken along section line 19-19 of FIG. 16.

FIG. 19 is a cross-sectional side view of integrated circuit 10 taken along section line 19-19 of FIG. 16, i.e., a cross-sectional side view taken through field region 18 and sub-area 16B. FIG. 19 follows from FIG. 14. What is shown in FIG. 19 is dielectric layer 172 disposed on portion 170 of the tensilely stressed PECVD nitride layer. Portion 190 of trench 174 is formed by patterning a photoresist layer (not shown) on dielectric layer 172 and anisotropically etching the exposed portions of dielectric layer 172 using an etchant that etches silicon dioxide. The etch stops on portion 170 of the tensilely stressed PECVD nitride layer. The etchant is changed to etch the sub-portions of portion 168 of the compressively stressed PECVD nitride layer that are exposed by etching silicon dioxide layer 172. The etching of portion 170 of the tensilely stressed PECVD nitride layer occurs in a region having portions 168 and 170 of the PECVD nitride layers.

Figure 20:
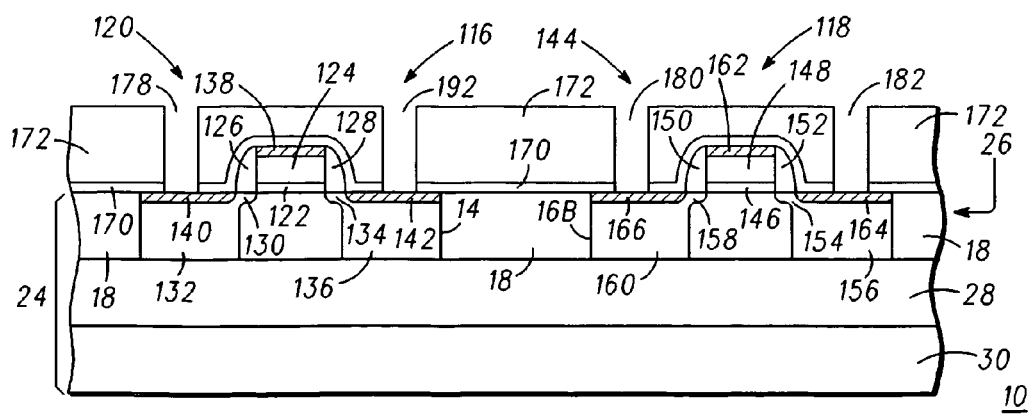
FIG. 20 is a cross-sectional side view of the integrated circuit taken along section line 20-20 of FIG. 16.

FIG. 20 is a cross-sectional side view of integrated circuit 10 taken along section line 20-20 of FIG. 16, i.e., a cross-sectional side view taken through active area 14, field region 18, and sub-area 16B. FIG. 20 follows from FIG. 15. What is shown in FIG. 20 is dielectric layer 172 disposed on portion 170 of the tensilely stressed plasma enhanced silicon nitride layer. Portion 192 of trench 174 and contact openings 180 and 182 are formed in dielectric layer 172 by patterning a photoresist layer (not shown) on dielectric layer 172 and anisotropically etching the exposed portions of dielectric layer 172 using an etchant that etches silicon dioxide. The etch stops on portion 170 of the tensilely stressed PECVD nitride layer. Thus, portion 170 of the tensilely stressed PECVD nitride layer is also referred to as an etch stop layer. After reaching portion 170, the etchant is changed to etch the portions of tensilely stressed PECVD exposed by etching silicon dioxide layer 172. The etching of the sub-portions of portion 170 of the tensilely stressed PECVD nitride layer terminates on silicide layers 140, 142, 164, and 166.

Figure 21:
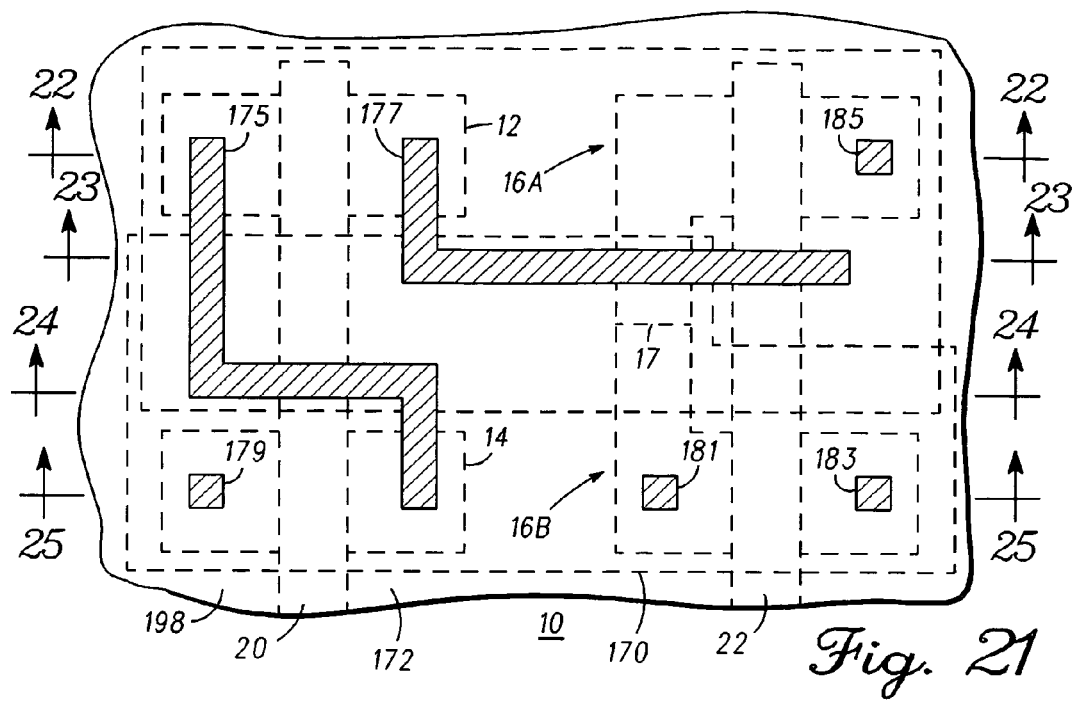
FIG. 21 is a top view of the integrated circuit of FIGS. 16-20 further along in manufacture.

Referring now to FIG. 21, a top view of an interconnect layer 198 is shown. Trenches 174 and 176 and contact openings 178, 180, 182, and 184 are filled with an electrically conductive material. Preferably, the electrically conductive material comprises a barrier layer lining trenches 174 and 176 and contact openings 178, 180, 182, and 184 and a metal disposed on the barrier layers. By way of example, the barrier layer is titanium tungsten and the metal is copper. Other suitable barrier layers include, but are not limited to titanium (Ti), titanium nitride (TiN), tantalum (Ta), tantalum nitride (TaN), and the like. Other suitable metals include aluminum, tungsten, and the like. Filling trenches 174 and 176 with the electrically conductive material forms electrical interconnects 175 and 177. Filling contact openings with electrically conductive material forms contacts 179, 181, 183, and 185. For the sake of clarity, the barrier layers and the metal disposed on the barrier layers are shown as a single structure in FIG. 21. However, for the sake of completeness, the barrier layers and the metal disposed on the barrier layers are shown in FIGS. 22-25.

Figure 22:
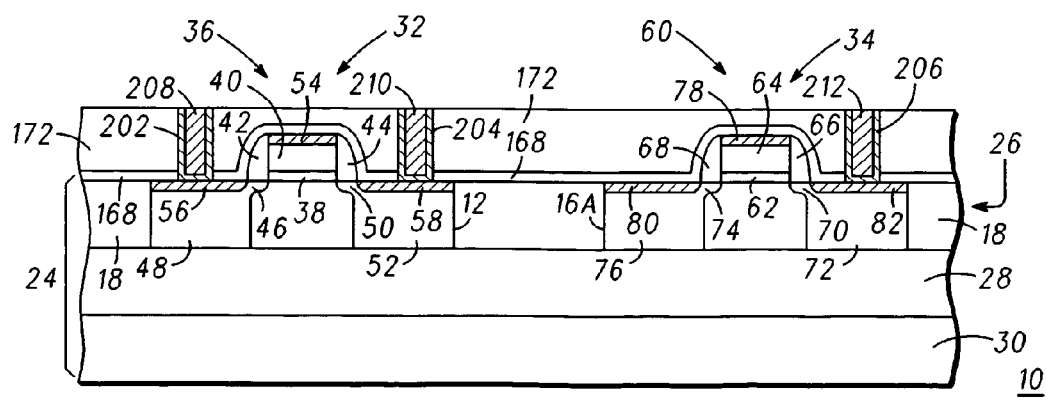
FIG. 22 is a cross-sectional side view of the integrated circuit taken along section line 22-22 of FIG. 21.

FIG. 22 is a cross-sectional side view of integrated circuit 10 taken along section line 22-22 of FIG. 21, i.e., a cross-sectional side view taken through active area 12 and sub-area 16A. FIG. 22 follows from FIG. 17. What is shown in FIG. 22 is a barrier layer 202 formed along the sidewalls and bottom of portion 186 of trench 174, a barrier layer 204 formed along the sidewalls and bottom of portion 194 of trench 176, and a barrier layer 206 formed along the sidewalls and bottom of contact opening 184. A metal layer 208 is formed on barrier layer 202 in trench 174, a metal layer 210 is formed on barrier layer 204 in trench 176, and a metal layer 212 is formed on barrier layer 206 in contact opening 184. In accordance with one embodiment, barrier layers 202, 204, and 206 are titanium tungsten and the metal of metal layers 208, 210, and 212 is copper.

Figure 23:
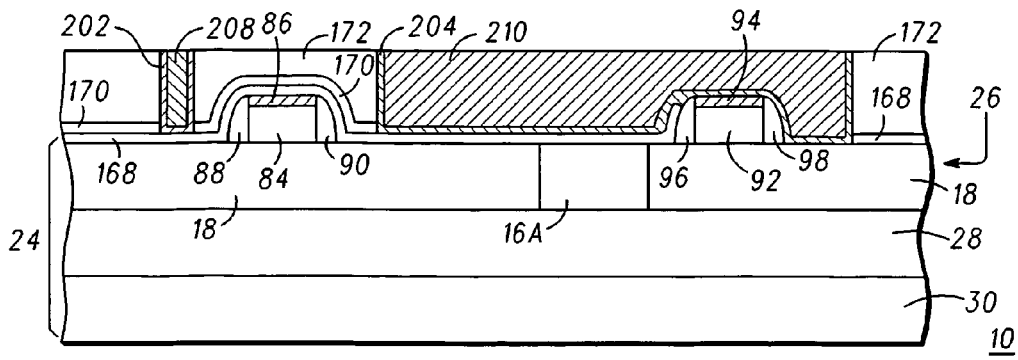
FIG. 23 is a cross-sectional side view of the integrated circuit taken along section line 23-23 of FIG. 21.

FIG. 23 is a cross-sectional side view of integrated circuit 10 taken along section line 23-23 of FIG. 21, i.e., a cross-sectional side view taken through field region 18 and sub-area 16A. FIG. 23 follows from FIG. 18. What is shown in FIG. 23 is barrier layer 202 formed along the sidewalls and bottom of portion 188 of trench 174 and barrier layer 204 formed along the sidewalls and bottom of portion 196 of trench 176. Metal layer 208 is formed on barrier layer 202 in trench 174 and a metal layer 210 is formed on barrier layer 204 in trench 176. As discussed with reference to the embodiment shown in FIG. 22, barrier layers 202 and 204 are titanium tungsten and the metal of metal layers 208 and 210 is copper.

Figure 24:
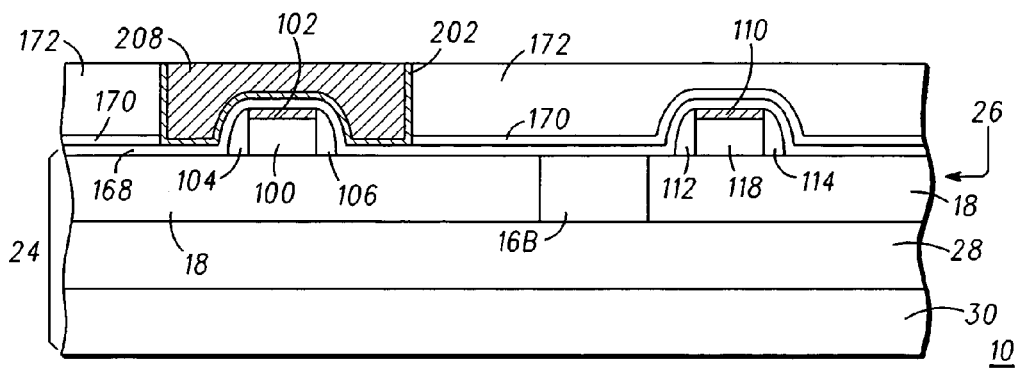
FIG. 24 is a cross-sectional side view of the integrated circuit taken along section line 24-24 of FIG. 21.

FIG. 24 is a cross-sectional side view of integrated circuit 10 taken along section line 24-24 of FIG. 21, i.e., a cross-sectional side view taken through field region 18 and sub-area 16B. FIG. 24 follows from FIG. 19. What is shown in FIG. 24 is barrier layer 202 formed along the sidewalls and bottom of portion 190 of trench 174. Metal layer 208 is formed on barrier layer 222 in trench 174. As discussed with reference to the embodiment shown in FIG. 22, barrier layer 202 is titanium tungsten and the metal of metal layer 208 is copper.

Figure 25:
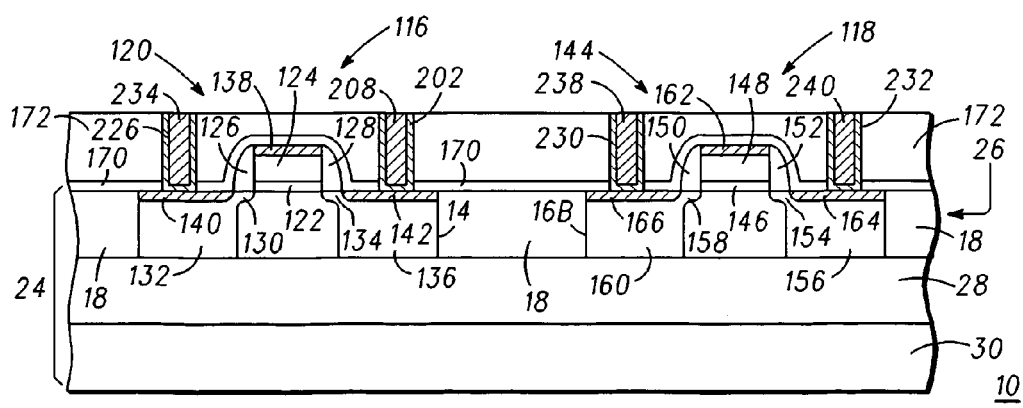
FIG. 25 is a cross-sectional side view of the integrated circuit taken along section line 25-25 of FIG. 21.

FIG. 25 is a cross-sectional side view of integrated circuit 10 taken along section line 25-25 of FIG. 21, i.e., a cross-sectional side view taken through active area 14, field region 18, and sub-area 16B. FIG. 25 follows from FIG. 20. What is shown in FIG. 20 is barrier layer 202 formed along the sidewalls and bottom of portion 192 of trench 174, barrier layer 226 formed along the sidewalls and bottom of contact opening 178, a barrier layer 230 formed along the sidewalls and bottom of contact opening 180, and a barrier layer 232 formed along the sidewalls and bottom of contact opening 182. Metal layer 208 is formed on barrier layer 202 in trench 174, a metal layer 234 is formed on barrier layer 226 in contact opening 178, a metal layer 238 is formed on barrier layer 230 in contact opening 180, and a metal layer 240 is formed on barrier layer 232 in contact opening 182. As discussed with reference to the embodiment shown in FIG. 22, barrier layers 202, 226, 230, and 232 are titanium tungsten and the metal of metal layers 208, 234, 238 and 240 is copper.

Figure 26:
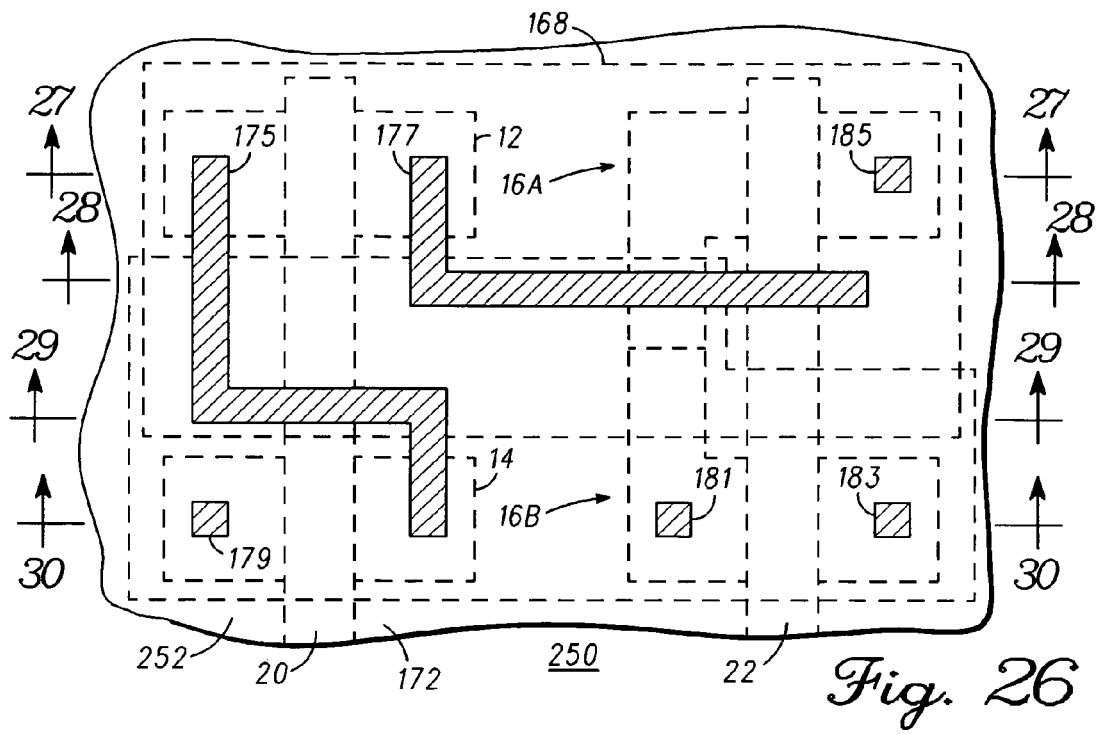
FIG. 26 is a top view of the integrated circuit in accordance with another embodiment of the present invention.

FIG. 26 is a top view of an integrated circuit 250 in accordance with another embodiment of the present invention is shown. It should be understood that integrated circuit 250 is similar to integrated circuit 10 except that it uses multi-layer dielectric stacks 268 and 300 in place of dielectric layers 168 and 170, respectively, of integrated circuit 10. Integrated circuit 250 has electrical interconnects 175 and 177 and contacts 179, 181, 183, and 185. Formation of interconnects 175 and 177 and contacts 179-185, are shown and described with reference to FIGS. 16-25.

Figure 27:
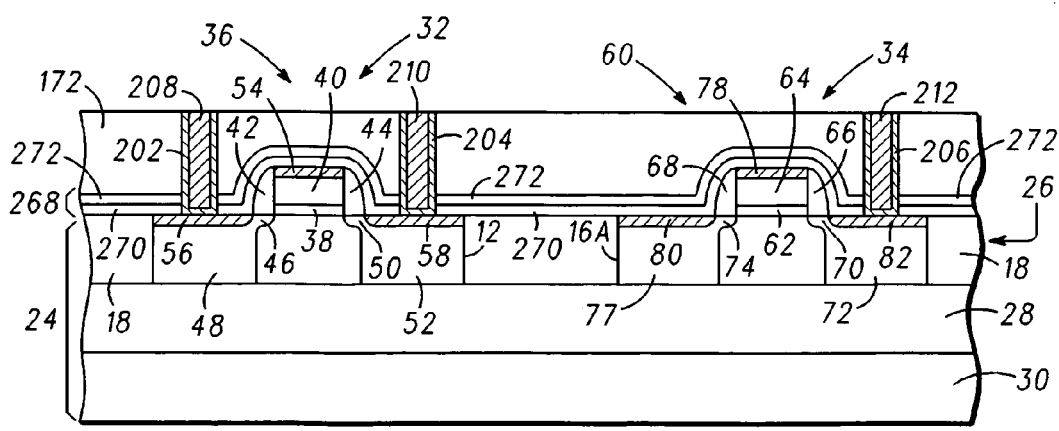
FIG. 27 is a cross-sectional side view of the integrated circuit taken along section line 27-27 of FIG. 26.

FIG. 27 is a cross-sectional side view of integrated circuit 250 taken along section line 27-27 of FIG. 26, i.e., a cross-sectional side view taken through active area 12 and sub-area 16A. What is shown in FIG. 27 is P-channel insulated gate field effect transistors 32 and 34 formed from SOI substrate 26. A multi-layer dielectric stack 268 is formed on P-channel insulated gate field effect transistors 32 and 34 and SOI substrate 26. Multi-layer dielectric stack 268 comprises a nitride layer 272 disposed on an oxide layer 270, which is disposed on SOI substrate 24, gate structures 36 and 60, spacers 42, 44, 66, and 68, and silicide regions 54, 56, 58, 78, 80, and 82. By way of example, oxide layer 270 has a thickness ranging from about 50 Å to about 500 Å and nitride layer 272 has a thickness ranging from about 50 Å to about 5,000 Å. Preferably, nitride layer 272 is a compressively stressed PECVD nitride layer similar to the nitride layer of portion 168 of the compressively stressed PECVD nitride layer.

Multi-layer stack 300 comprises a nitride layer 304 disposed on an oxide layer 302, which is disposed PECVD nitride layer 272. By way of example, oxide layer 302 has a thickness ranging from about 50 Å to about 500 Å and nitride layer 304 has a thickness ranging from about 50 Å to about 5,000 Å. Preferably, nitride layer 304 is a tensilely stressed PECVD nitride layer similar to the nitride layer of portion 170 of the tensilely stressed PECVD nitride layer. Multi-layer stack 300 is shown in FIGS. 28-30.

A layer of dielectric material 172 is disposed on compressively stressed PECVD nitride layer 304. Trenches 174 and 176 formed in dielectric layer 172 expose silicide layers 56 and 58 and a contact opening 184 formed in dielectric layer 172 exposes silicide layer 82. A barrier layer 202 is formed along the sidewalls and bottom of trench 174, a barrier layer 204 is formed along the sidewalls and bottom of trench 176, and a barrier layer 206 is formed along the sidewalls and bottom of contact opening 184. A metal layer 208 is formed on barrier layer 202 in trench 174, a metal layer 210 is formed on barrier layer 204 in trench 176, and a metal layer 212 is formed on barrier layer 206 in contact opening 184. As discussed with reference to the embodiment shown in FIG. 22, barrier layers 202, 204, and 206 are titanium tungsten and the metal of metal layers 208, 210, and 212 is copper.

Figure 28:
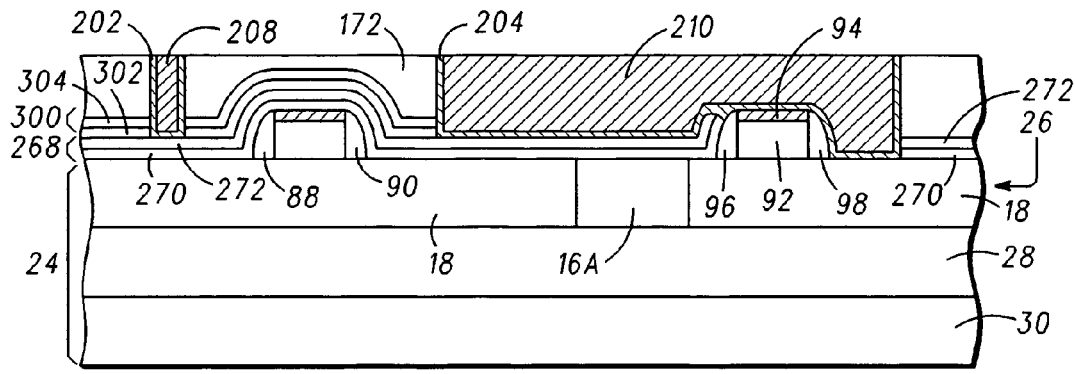
FIG. 28 is a cross-sectional side view of the integrated circuit taken along section line 28-28 of FIG. 26.

FIG. 28 is a cross-sectional side view of integrated circuit 250 taken along section line 28-28 of FIG. 26, i.e., a cross-sectional side view taken through field region 18 and sub-area 16A. What is shown in FIG. 28 is a barrier layer 202 formed along the sidewalls and bottom of portion 188 of trench 174 and a barrier layer 204 formed along the sidewalls and bottom of portion 196 of trench 176. A metal layer 208 is formed on barrier layer 202 in trench 174 and a metal layer 210 is formed on barrier layer 204 in trench 176. As discussed with reference to the embodiment shown in FIG. 22, barrier layers 202 and 204 are titanium tungsten and the metal of metal layers 208 and 210 is copper.

Figure 29:
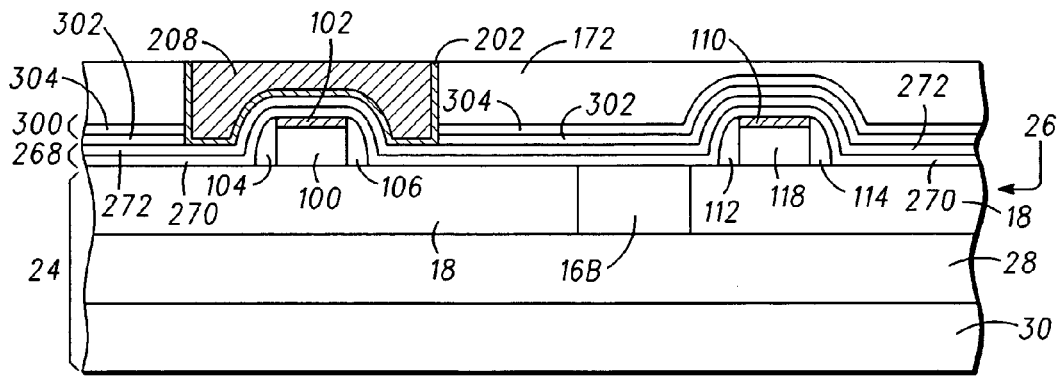
FIG. 29 is a cross-sectional side view of the integrated circuit taken along section line 29-29 of FIG. 26.
Figure 30:
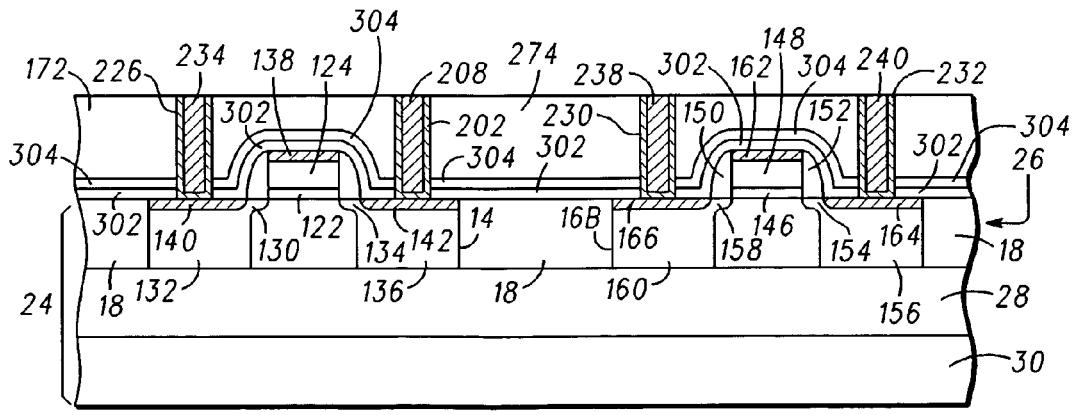
FIG. 30 is a cross-sectional side view of the integrated circuit taken along section line 30-30 of FIG. 26.

FIG. 29 is a cross-sectional side view of integrated circuit 250 taken along section line 29-29 of FIG. 26, i.e., a cross-sectional side view taken through field region 18 and sub-area 16B. What is shown in FIG. 29 is a barrier layer 202 formed along the sidewalls and bottom portion of trench 174. A metal layer 208 is formed on barrier layer 202 in trench 174. As discussed with reference to the embodiment shown in FIG. 22, barrier layer 202 is titanium tungsten and the metal of metal layer 208 is copper.

FIG. 30 is a cross-sectional side view of integrated circuit 250 taken along section line 30-30 of FIG. 26, i.e., a cross-sectional side view taken through active area 14, field region 18, and sub-area 16B. What is shown in FIG. 30 is a barrier layer 202 formed along the sidewalls and bottom portion of trench 174, a barrier layer 226 formed along the sidewalls and bottom of contact opening 178, a barrier layer 230 formed along the sidewalls and bottom of contact opening 180, and a barrier layer 232 formed along the sidewalls and bottom of contact opening 182. A metal layer 208 is formed on barrier layer 202 in trench 174, a metal layer 234 is formed on barrier layer 226 in contact opening 178, a metal layer 238 is formed on barrier layer 230 in contact opening 180, and a metal layer 240 is formed on barrier layer 232 in contact opening 182. As discussed with reference to the embodiment shown in FIG. 22, barrier layers 226, 228, 230, and 232 are titanium tungsten and the metal of metal layers 208, 236, 238 and 240 is copper.

By now it should be appreciated that an integrated circuit and a method for manufacturing the integrated circuit have been provided. An advantage of integrated circuits in accordance with the present invention is that it increases electrical interconnect routing versatility by dielectrically isolating electrical interconnects from other electrically conductive elements of the integrated circuit. In addition, the method and materials can be implemented in a manufacturing process in a cost efficient and in a time efficient manner.

Although certain preferred embodiments and methods have been disclosed herein, it will be apparent from the foregoing disclosure to those skilled in the art that variations and modifications of such embodiments and methods may be made without departing from the spirit and scope of the invention. For example, the tensilely stressed PECVD nitride layer may be formed before the compressively stressed PECVD nitride layer. It is intended that the invention shall be limited only to the extent required by the appended claims and the rules and principles of applicable law.

What is claimed is:

1. A method for manufacturing an integrated circuit, comprising the steps of:

providing a semiconductor substrate having first and second active areas that are electrically isolated from each other by a field region;

forming a first semiconductor device from the first active area and a second semiconductor device from the second active area;

forming a first layer of dielectric material over the first active area and over the field region, and forming the first layer of dielectric material over the second active area and removing the portion of the first layer of dielectric material that is over the second active area; and forming a second layer of dielectric material over the second active area and over the portion of the first layer of dielectric material and over the field region, and forming the second layer of dielectric material over the first active area and removing the portion of the second layer of dielectric material that is over the first active area, wherein the first layer of dielectric material is substantially absent from areas over the second active area and the second layer of dielectric material is substantially absent from areas over the first active area.

2. The method of claim 1, wherein the step of forming the first semiconductor device from the first active area and the second semiconductor device from the second active area includes:

forming a first layer of polysilicon over the first active area and the field region; and forming a second layer of polysilicon over the second active area and the field region, wherein the first and second layers of polysilicon are spaced apart from each other.

3. The method of claim 2, further including the step of forming an electrical interconnect over the first layer of polysilicon, the electrical interconnect dielectrically isolated from the first layer of polysilicon.

4. The method of claim 2, further including the step of forming another electrical interconnect, the another electrical interconnect electrically isolated from the second active area and electrically contacting the second layer of polysilicon.

5. The method of claim 2, wherein the electrical interconnect is electrically coupled to the first semiconductor device and the second electrical interconnect is electrically coupled to the second semiconductor device.

6. The method of claim 5, further including the step of using a damascene process to form the electrical interconnect and the another electrical interconnect.

7. The method of claim 2, wherein the first layer of dielectric material is a dielectric material selected from the group of dielectric materials comprising silicon nitride, compressively stressed silicon nitride, tensilely stressed silicon nitride, silicon dioxide, fluorinated silica, silicon oxynitride, silicon carbide, silicon oxycarbide, silicon carbon nitride, amorphous silicon, methyl silsesquioxane, and polymeric films.

8. The method of claim 7, wherein the second layer of dielectric material is a dielectric material selected from the group of dielectric materials comprising silicon nitride, compressively stressed silicon nitride, tensilely stressed silicon nitride, silicon dioxide, fluorinated silica, silicon oxynitride, silicon carbide, silicon oxycarbide, silicon carbon nitride, amorphous silicon, methyl silsesquioxane, and polymeric films.

9. The method of claim 1, wherein the step of providing the semiconductor substrate includes providing a Semiconductor-on-Insulator (SOI) substrate.

* * * * *